(12) United States Patent
Geetla

(10) Patent No.: US 11,424,748 B1
(45) Date of Patent: Aug. 23, 2022

(54) MODIFIED PID LOOP FILTER TO SUPPRESS HIGH FREQUENCY NOISE IN DIGITAL PHASE LOCKED LOOP

(71) Applicant: NXP B.V., Eindhoven (NL)

(72) Inventor: Ravichandar Reddy Geetla, Austin, TX (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/398,228

(22) Filed: Aug. 10, 2021

(51) Int. Cl.
*H03L 7/093* (2006.01)
*H03L 7/089* (2006.01)
*H03L 7/099* (2006.01)

(52) U.S. Cl.
CPC .............. *H03L 7/093* (2013.01); *H03L 7/089* (2013.01); *H03L 7/0992* (2013.01)

(58) Field of Classification Search
CPC ... H03L 2207/50; H03L 7/0991; H03L 7/099; H03L 7/093
See application file for complete search history.

(56) References Cited

U.S. PATENT DOCUMENTS

| | | | |
|---|---|---|---|
| 7,042,972 B2 | 5/2006 | Fahim | |
| 7,911,248 B2 * | 3/2011 | Choi | H03L 7/0991 327/159 |
| 7,999,586 B2 * | 8/2011 | Lee | H03L 7/085 327/159 |
| 8,559,579 B2 | 10/2013 | Staszewski et al. | |
| 8,901,975 B2 | 12/2014 | Navid | |
| 9,041,443 B2 | 5/2015 | Jang et al. | |
| 9,407,270 B2 | 8/2016 | Unruh | |
| 2011/0156783 A1 | 6/2011 | Pavlovic et al. | |
| 2015/0015308 A1 | 1/2015 | Da Dalt | |

OTHER PUBLICATIONS

Michael H. Perrott, Tutorial on Digital Phase-Locked Loops, CICC 2009, Sep. 2009.
Won Namgoong, A Modified Proportional-Integral Loop Filter to Suppress DCO Noise in Digital PLL, IEEE Transactions on Circuits and Systems—II: Express Briefs, vol. 65, No. 8, Aug. 2018.
Jun Zhao et al., A Low-Power Digitally Controlled Oscillator for All Digital Phase-Locked Loops, Research Article, VLSI Design, vol. 2010, 11 pages, received May 31, 2009, accepted Oct. 20, 2009.

* cited by examiner

*Primary Examiner* — Diana J. Cheng

(57) ABSTRACT

A PID loop filter control method and apparatus are provided for generating a control signal to control a digitally controlled oscillator which generates a phase locked loop clock signal, where the PID loop filter includes a proportional-integral-derivative (PID) controller connected and configured to produce a PID controller output signal, and a transformed feedback module having a feedback summer circuit and internal gain stage connected in series to produce an M-bit control signal in response to the PID controller output signal, wherein an output from internal gain stage is provided over a feedback path comprising a feedback gain stage having a configurable Kfb gain value (e.g., 0<Kfb<4) and a filter element to produce the internal feedback signal which is summed with the PID controller output signal to low pass filter high frequency spurs and noise from the PID controller output signal.

18 Claims, 7 Drawing Sheets

MODIFIED PID LOOP FILTER TO SUPPRESS HIGH FREQUENCY NOISE IN DIGITAL PHASE LOCKED LOOP

BACKGROUND OF THE INVENTION

Field of the Invention

The present invention is directed in general to electronic circuits. In one aspect, the present invention relates to digital phase locked loop circuits.

Description of the Related Art

A phase-locked loop or phase-locked loop (PLL) is a control system that generates an output signal whose phase is related to the phase of an input signal. Generally speaking, PLLs can be implemented as electronic circuits having a variable frequency oscillator and a phase and/or frequency detector in a feedback loop so that the oscillator generates a periodic signal which is fed back to the phase detector for phase and/or frequency comparison with the phase/frequency of the input periodic signal so that the oscillator can be adjusted to keep the phases/frequencies matched. Widely employed in radio, telecommunications, computers and other electronic applications, phase-locked loops are used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block, the technique is widely used in modern electronic devices, with output frequencies up to many gigahertz.

With digital implementations, PLL circuits typically use a proportional-integral-derivative (PID) controller as loop filter which controls a DCO (Digitally Controlled Oscillator) which generates an output clock frequency signal which provided to a frequency divider circuit before being fed back to the phase/frequency detector for phase/frequency comparison with the input signal. However, there a number of challenges with conventionally implemented digital PLL circuits. For example, frequency divider circuits may only allow division by integer values when digitally controlling the PLL output frequency. In addition, there are quantization noise issues introduced with digital PLLs which can limit the PLL bandwidth and increase the linearity requirements of the phase detector. For example, there can be high frequency spurs in the output of the PID controllers which appear at the output from the DCO, thereby increasing jitter at the DCO output. Other disadvantages in terms of frequency spurs can be associated with the prior art. While some solutions for resolving output jitter have been proposed with analog PLL designs, there are difficulties with digital implementations because of the discrete nature of the PID and the DCO in such digital PLLs. As a result, the existing solutions for accurately synthesizing frequency signals with digital PLLs are extremely difficult at a practical level in terms of generating a digital controlled output clock signal with a compact size digital PLL circuit that provides fine control of the output clock signal with reduced or eliminated frequency spurs.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

Figure 1:
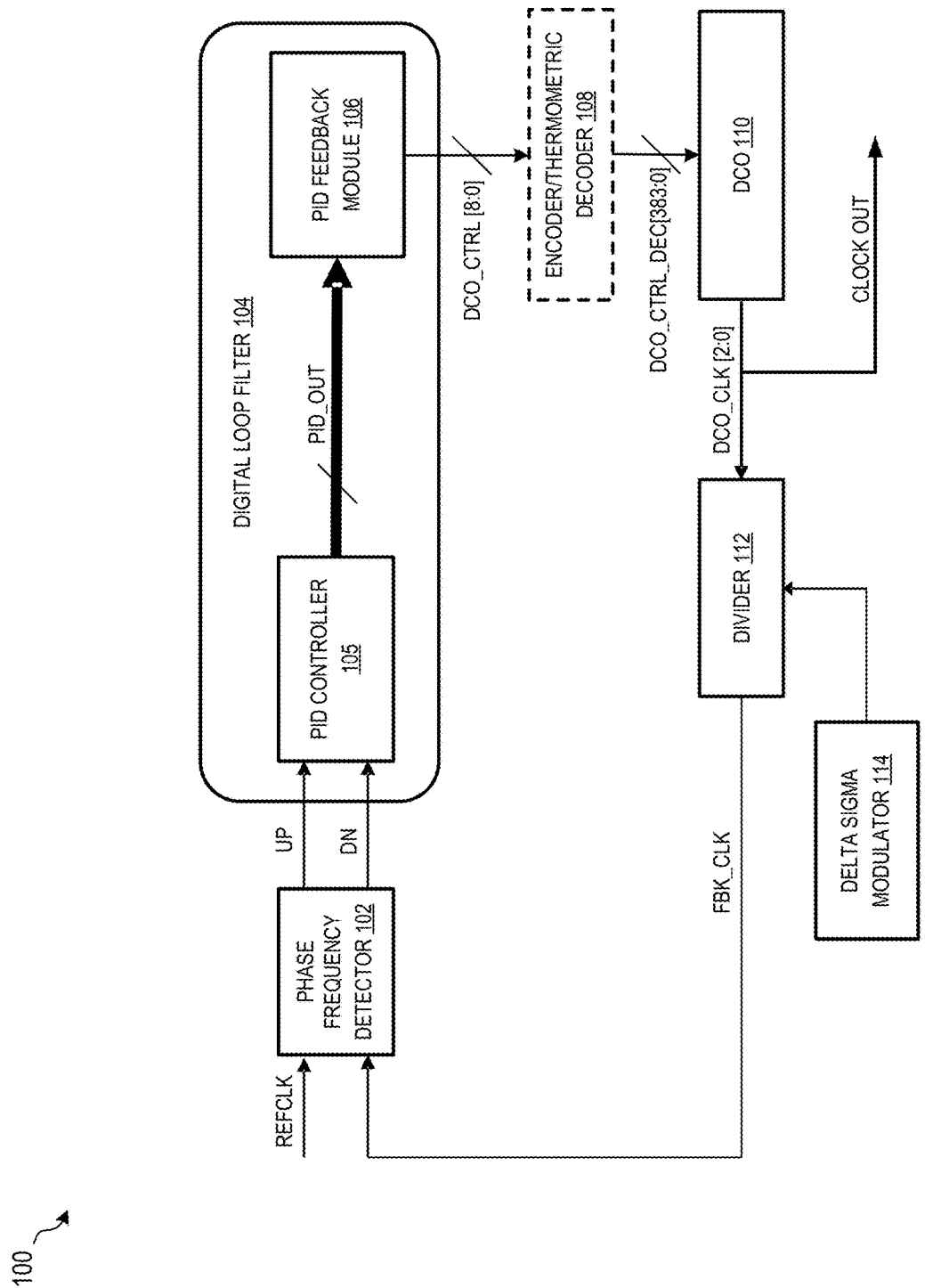
FIG. 1 illustrates a high-level block diagram of a fractional digital phase-locked loop (PLL) circuit that may be used to perform the PLL-based frequency synthesizer techniques in accordance with selected embodiments of the present disclosure.

A digital phase locked loop method and apparatus are described for using a modified proportional-integral-derivative (PID) loop filter to control a digitally controlled oscillator (DCO) by effectively implementing a differential high pass filter feedback element with a transformed feedback module connected to the output of a PID controller, thereby decreasing jitter and improving frequency variation by suppressing high frequency noise in the DCO output. In selected embodiments, the modified PID loop filter includes a PID controller connected with a PID feedback module having high pass characteristics and a programmable feedback gain element connected in a negative feedback path to an input of the PID controller to mimic a low pass filter for removing high-frequency DCO control ripples that can be generated by the PID controller. In other embodiments, the modified PID loop filter includes a transformed feedback module having low pass characteristics and a programmable feedback gain element connected in a positive feedback path to an output of the PID controller to mimic a low pass filter for removing DCO control ripples that can be generated by the PID controller. As disclosed herein, the modified PID loop filter may be implemented with a plurality of programmable gain elements that are connected and configured to form the PID controller and PID feedback module. To implement the digital equivalent of a differential PID feedback path having a high-pass characteristic, the transformed feedback module connected at the output of the PID controller may include an input up-gain (Ks) stage and output down-gain (1/Ks) stage which, respectively, scale "up" and "down" the transformed feedback module input and output for improved resolution. In addition, the transformed feedback module includes a series-connected feedback summer circuit and internal gain stage (1/y gain) connected between the input up-gain stage and output down-gain stage to generate an internal feedback signal which is amplified by a feedback gain stage (Kfb) before being supplied to a feedback transform stage having specified high-pass characteristics $((K_P+2*K_D)z^{-1}-(K_D)z^{-2})$ which effectively mimic the effect of small capacitor or low pass filter that is used in analog PLL circuits to filter out DCO ripples caused by high frequency spurs and noise generated by the PID controller. By choosing the appropriate value for programmable gain parameter Kfb for the feedback gain stage (e.g., 0<Kfb<4) based on the other gain parameters (Kp, Ki, Kd, Kn, and Ks), the modified PID loop filter generates a DCO control signal with reduced high frequency spurs from the PID controller, thereby reducing peak-to-peak period jitter. And by converting the DCO control signal to an encoded binary code value which is then converted to a thermometric code that can be used by the DCO to equalize the delay at the DCO stages, the DCO can generate an output clock signal frequency that is directly proportional to the DCO control signal with reduced input dependent duty cycle variations in DCO output.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified schematic circuit block diagrams without including every circuit element or detail in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to illustrate specific details. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

To provide additional details for a contextual understanding of the present disclosure, reference is now made to FIG. 1 which shows a high-level block diagram of a fractional digital phase-locked loop (PLL) circuit 100 that may be used to perform the PLL-based frequency synthesizer techniques. When implemented with a digital PLL architecture, the digital PLL circuit 100 includes a phase frequency detector 102, a digital loop filter 104, an optional encoder/thermometric encoder 108, a digitally controlled oscillator 110, a frequency or loop divider 112, and a delta-sigma modulator 114.

As depicted, the digital PLL circuit 100 is connected to receive a reference clock signal REFCLK, and to generate an output clock signal CLOCK OUT based on the reference clock signal REFCLK such that output clock signal has a frequency profile that conforms to a target frequency profile. As will be appreciated, the reference clock signal REFCLK may be a periodic signal that oscillates at a fixed frequency and may have any suitable waveform shape, such as a square wave or a sinusoid wave. In selected embodiments, the reference clock signal REFCLK may be generated by a crystal-controlled oscillator that oscillates at a fixed frequency (e.g., 24 MHz). In addition, the output clock CLOCK OUT may have a frequency profile that is determined by a target frequency profile for digital PLL circuit 100. For example, the output clock CLOCK OUT may be a chirp signal having a periodic function with a frequency that varies with respect to time (e.g., a ramp or sawtooth or triangle function or other types of linear and/or non-linear frequency profiles).

The depicted phase frequency detector 102 is connected and configured to receive the reference clock signal REFCLK and a feedback signal FBK_CLK, and to generate an output phase difference signal comprising up/down values UP, DN based on the reference clock signal REFCLK and feedback signal FBK_CLK. Phase difference signal UP, DN may be indicative of a phase difference between the reference clock signal REFCLK and feedback signal FBK_CLK. To generate the phase difference signal UP, DN, the phase frequency detector 102 may use any suitable phase frequency determination techniques known in the art, including but not limited to a digital or phase detector (e.g., a bang-bang phase detector) which generates a value of positive one or a value of negative one based on the sign of the phase difference between the reference clock signal REFCLK and a feedback signal FBK_CLK.

The phase difference signal UP, DN output from the phase frequency detector 102 feeds into a digital loop filter 104 which produces an M-bit DCO control output signal (DCO_CTRL). The DCO control output signal (DCO_CTRL) may correspond to a filtered version of phase difference signal UP, DN. As depicted, the digital loop filter 104 can be implemented with a proportional-integral-derivative (PID) controller 105 and PID feedback module 106 which are connected to receive the phase difference signal UP, DN output and generate an M-bit DCO control output signal (DCO_CTRL). During operation of digital loop filter 104, the PID controller 105 receives the phase difference or error signal UP, DN output from the PFD 102, and applies the signal to a plurality of branches which apply respective gain parameters (e.g., P, I, and D) provided to the PID controller 105 to produce the output PID correction signal PID_OUT. Instead of applying the output PID correction signal PID_OUT to directly control the DCO 110, the PID feedback module 106 is connected and configured to receive the output PID correction signal PID_OUT and to generate the M-bit DCO control output signal (DCO_CTRL) by effectively adding a differential feedback path to the PID controller 105 to lowpass filter or remove high frequency spurs from the output PID correction signal PID_OUT.

The DCO control output signal (DCO_CTRL) output from the digital loop filter 104 feeds into a control input of the DCO 110, either directly or indirectly through the optional encoder/thermometric encoder 108. In selected embodiments, the DCO control output signal generated by the digital loop filter 104 feeds into the encoder/thermometric decoder module 108 where the DCO control signal is converted to an encoded binary code value, and then converted or decoded into a thermometric code (DCO_CTRL_DEC). Instead of using a conventional binary-tothermometer decoding, the encoder/thermometric decoder module 108 includes an encoder which converts a binary input to an encoded binary code, and also includes a decoder that converts the encoded binary code to a thermometric code which is provided as a decoded DCO control output signal (DCO_CTRL_DEC) to the DCO 110 to enable uniform delays from each stage of DCO, thereby reducing variation in duty cycle.

The DCO 110 is connected and configured to receive the (decoded) DCO control output signal (DCO_CTRL), and to generate the DCO clock output signal CLOCK OUT to have a frequency that is controlled by the DCO control output signal (DCO_CTRL). The DCO clock output signal CLOCK OUT is also provided to the divider 112 which generates a feedback signal FBK_CLK to the phase frequency detector 102. In selected embodiments, the divider 112 is configured to receive the different phases of the DCO clock output DCO_CLOCK, and to generate the feedback signal FBK_CLK based on a frequency divider control signal which may be indicative of a division factor (N) to be used for dividing the frequency of DCO clock output DCO_CLOCK. Frequency divider 112 may generate feedback signal FBK_CLK such that the frequency of feedback signal FBK_CLK is approximately equal to the quotient of the frequency of DCO clock output DCO_CLOCK divided by N. In other embodiments, the frequency divider 112 may be a fractional-N frequency divider that is configured to divide the frequency of DCO clock output DCO_CLOCK by an integer or fractional factor (N). In such embodiments, the frequency or loop divider 112 may be connected to receive a frequency divider control signal from a delta-sigma modulator 114 which provides a frequency divider control function by generating a dither divide value for the divider 112 to achieve fractional divide values. As a result, the frequency/loop divider 112 generates a feedback signal FBK_CLK which corresponds to a frequency-divided version of the output clock signal CLOCK OUT.

In the example shown in FIG. 1, the node in the forward signal path of digital PLL circuit 100 that is modulated by the PID feedback module 106 may be located between the PID controller 105 and the DCO 110 of the digital PLL circuit 100. In other examples, the node may be located in other places of the forward signal path of digital PLL circuit 100. For example, the node may be located inside of PID controller 105 of the digital PLL circuit 100. In general, the forward signal path of digital PLL circuit 100 may refer to the signal path between phase frequency detector 102 and the DCO 110 of the digital PLL circuit 100, and the feedback signal path of digital PLL circuit 100 may refer to the signal path from the DCO 110 over the divider 112 to the phase frequency detector 102 in the digital PLL circuit 100.

Figure 2:
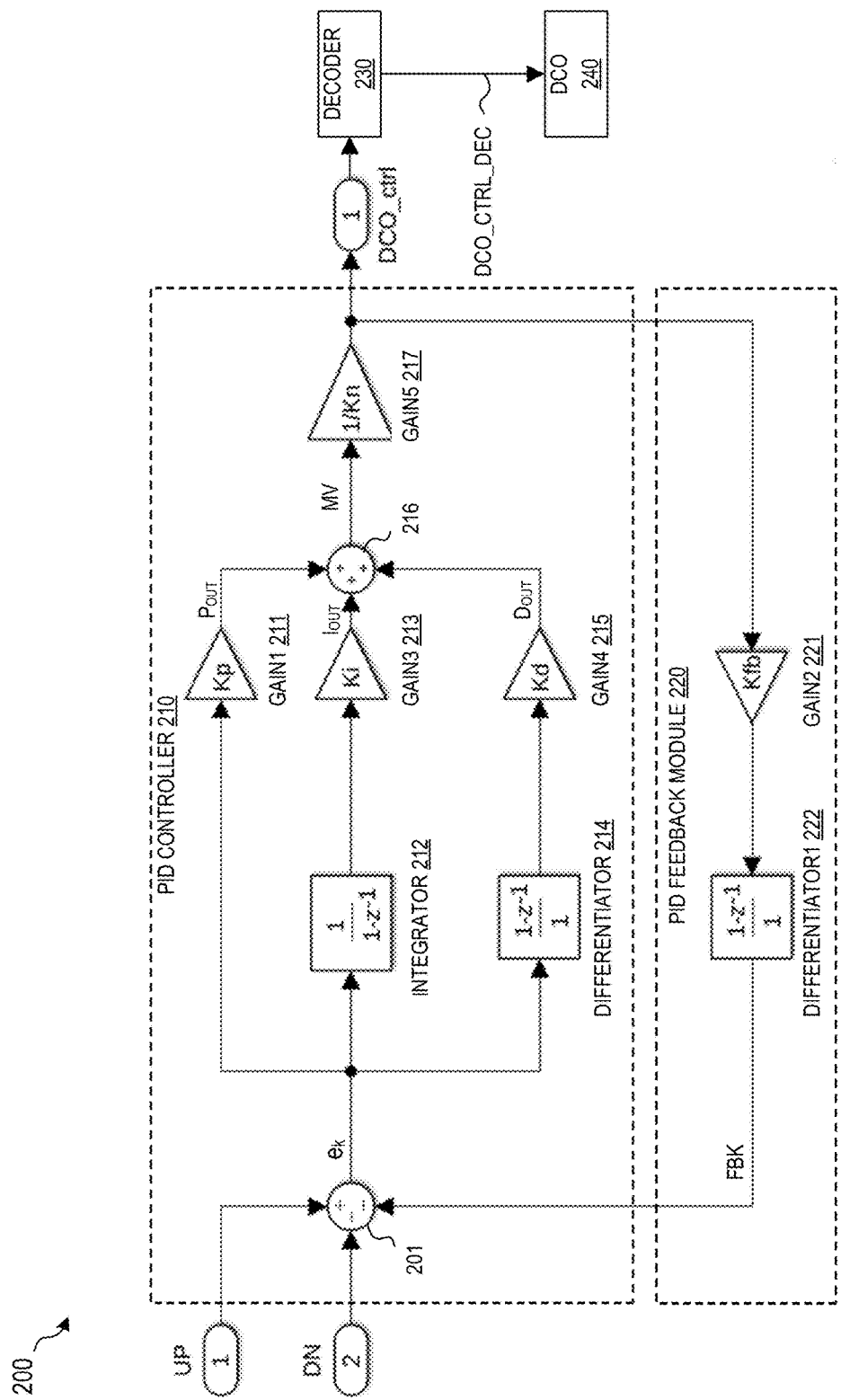
FIG. 2 illustrates a schematic circuit block diagram of a digital loop filter having a PID controller and differential PID feedback module in accordance with selected embodiments of the present disclosure.

Turning now to FIG. 2, there is shown a simplified schematic circuit block diagram of a digital loop filter 200 having a PID controller 210 and differential PID feedback module 220 in accordance with selected embodiments of the present disclosure. As depicted, the PID controller 210 includes a differential summer circuit 201 which is connected to receive input up/down values UP, DN representing a phase difference signal between a reference clock signal and feedback clock signal. At the differential summer circuit 201, the input down value DN and feedback signal FBK are subtracted from the input up value UP, thereby computing the error measure ($e_k$). In addition, the PID controller 210 includes a plurality of PID branches that are programmed with one or more gain parameter input signals (Kp, Ki, Kd, Kn) to generate a DCO control output signal (DCO_CTRL). In particular, the PID controller 210 may include a proportional gain branch 211, an integral gain branch 212/213, a derivative gain branch 214/215, and a compensation summer 216. Each of the branches 211-215 may receive the accumulated error signal ($e_k$) produced by the differential error summer 201. The compensation summer 216 may produce a manipulated variable (MV), which may equal the sum of the branches 211-215. The PID controller 210 also includes an output multiplier 217 which multiplies the manipulated variable (MV) by the gain constant 1/Kn to generate the DCO control output signal (DCO_CTRL).

As will be appreciated, the differential summer 201 functions to accumulate error signal values that the PID controller branches 211-215 could use to produce compensation signals for a control signal. In particular, the proportional branch 211 may include a first gain buffer 211 which applies a programmable proportional gain constant Kp to the error signal $e_k$, thereby producing a proportional output $P_{OUT}$. In addition, the integral branch 212/213 may include an integrator 212 connected in series with a second gain buffer 213 which applies a programmable integral gain constant Ki, such that the integral branch receives the error signal $e_k$ and produces an integral output $I_{OUT}$ that is equal to the product of the integral of the error signal $e_k$ and the integral gain constant Ki. Finally, the derivative branch 214/215 may include a differentiator 214 connected in series with a third gain buffer 215 which applies a derivative gain constant Kd, such that the derivative branch receives the error signal $e_k$ and produces a derivative output $D_{OUT}$ that is equal to the product of the derivative of the error signal $e_k$ and the derivative gain constant Kd.

Compensation summer 216 may receive the proportional output $P_{OUT}$ from the proportional gain stage 211, the integral output $I_{OUT}$ from the integral gain stage 212/213, and the derivative output $D_{OUT}$ from the derivative gain stage 214/215. Based on these inputs, the compensation summer 216 may then produce a manipulated variable MV=$e_k$ (Kp+Ki/1-$z^{-1}$+Kd(1-$z^{-1}$)) in discrete-frequency domain (z-domain). The manipulated variable MV is then provided to the output multiplier 217 which multiplies the manipulated variable (MV) by the gain constant 1/Kn to generate the DCO control output signal (DCO_CTRL) which is provided to the decoder 230.

The digital loop filter 200 also includes a PID feedback module 220 which connects the DCO control output signal (DCO_CTRL) in a differential feedback arrangement to the PID controller 210 through the differential summer 201. As depicted, the PID feedback module 220 includes a feedback gain buffer 221 which applies a programmable feedback gain constant Kfb connected in series with a differentiator 222 which acts as a high pass filter. As a result, the PID feedback module 220 produces the feedback signal FBK that is equal to the product of the derivative of the DCO control output signal (DCO_CTRL) amplified by the feedback gain constant Kfb. In this way, the PID feedback module 220 effectively provides a high pass filtered version of the DCO control output signal (DCO_CTRL) as an input to the differential summer 201.

As depicted, the functionality of the PID controller 210 may be implemented with the disclosed elements 211-217 in the depicted arrangement to generate the DCO control signal DCO_CTRL, though any suitable control loop circuit mechanism may be used in the PID controller 210 to continuously calculate an error value $e_k$ and apply a correction based on proportional, integral, and derivative terms (denoted P, I, ad D, respectively). However generated, the DCO control signal is provided to the decoder 230 which generates a decoded control signal DCO_CTR_DEC that is provided to control the digitally controlled oscillator (DCO) 240 in order to adjust the frequency of the DCO 240 as appropriate.

As disclosed herein, the programmable nature of the gain parameter input signals (Kp, Ki, Kd, Kn, Mb) enable the design and operation of the digital loop filter 200 to be adjusted and configured as desired. For example, by setting the feedback gain constant Kfb=0, the PID feedback module 220 is effectively open, and the digital loop filter 200 operates as a conventional PID controller 210. However, by setting the feedback gain constant Kfb>0, the PID feedback module 220 is connected to provide the output signal DCO_CTRL from PID controller 210 into a negative feedback path with a high pass filter element 222 and a programmable loop filter feedback gain 221 to an input of the PID controller 210, thereby providing the DCO control output signal (DCO_CTRL) with a low pass characteristic which removes high frequency spurs and noise that would otherwise be generated by the PID controller 210.

As will be appreciated, there are practical challenges with digitally implementing the digital loop filter 200 since digital computations work on time-sampled data. For example, if the digital loop filter 200 is processing the $10^{th}$ input sample, the differential summer 201 should be combining the $10^{th}$ input up/down values UP[10], DN[10] with the $10^{th}$ DCO_CTRL[10], but the $10^{th}$ DCO_CTRL[10] is not available until after a computational delay required for processing by the PID controller 210. To address these challenges, a transformed feedback module may be connected at the output of the PID controller to implement the functional or mathematical equivalent of providing a negative feedback path to the PID controller input which includes a high pass filter element and loop filter feedback gain element, but without requiring actual feedback to the PID controller input.

Figure 3:
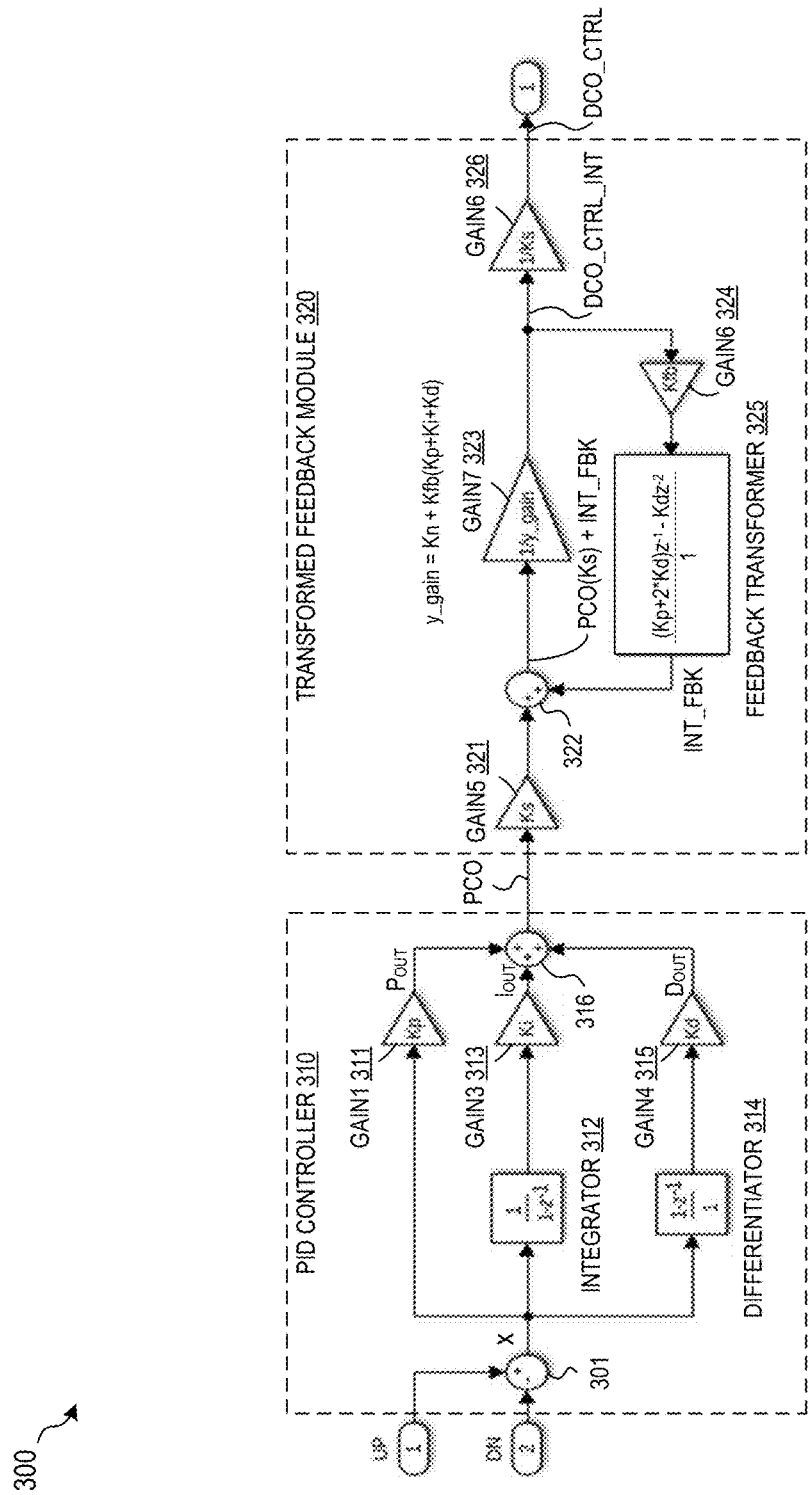
FIG. 3 illustrates a schematic circuit block diagram of a digital loop filter having a PID controller and transformed feedback module in accordance with selected embodiments of the present disclosure.

To provide additional details for an improved understanding of a digital loop filter which employs a transformed feedback module, reference is now made to FIG. 3 which shows a schematic circuit block diagram of a digital loop filter 300 having a PID controller 310 and transformed feedback module 320 in accordance with selected embodiments of the present disclosure. As depicted, the PID controller 310 is connected to receive input up/down values UP, DN representing a phase difference signal between a reference clock signal and feedback clock signal. At the differential summer circuit 301, the input down value DN is subtracted from the input up value UP, thereby computing therefrom the error measure (x). Notably, there is no feedback input to the differential summer circuit 301 of any filtered DCO control signal. At the PID controller 310, the error measure x is provided to a proportional gain branch 311, an integral gain branch 312/313, and a derivative gain branch 314/315, each of which is programmed with one or more gain parameter input signals (Kp, Ki, Kd, Kn). In particular, the proportional branch 311 includes a first gain buffer 311 which applies a programmable proportional gain constant Kp to the error signal x, thereby producing a proportional output $P_{OUT}$. In addition, the integral branch 312/313 includes an integrator 312 connected in series with a second gain buffer 313 which applies a programmable integral gain constant Ki to produce an integral output $I_{OUT}$ that is equal to the product of the integral of the error signal x and the integral gain constant Ki. Finally the derivative branch 314/315 includes a differentiator 314 connected in series with a third gain buffer 315 which applies a derivative gain constant Kd to produce a derivative output $D_{OUT}$ that is equal to the product of the derivative of the error signal x and the derivative gain constant Kd. The computational results of each branch are provided to a compensation summer 316 which combines the proportional output $P_{OUT}$, the integral output $I_{OUT}$, and the derivative output $D_{OUT}$, thereby generating the PID controller output (PCO) at the output of the PID controller 310. In contrast to the PID controller 210 shown in FIG. 2, the PID controller 310 does not include an output gain stage constant 1/Kn for directly generating the DCO control output signal (DCO_CTRL). As a result, the PCO signal from the PID controller 310 may be represented as PCO=x($K_P$+Ki/(1−$z^{-1}$)+Kd(1−$z^{-1}$)).

Instead of directly generating the DCO control output signal (DCO_CTRL), the PID controller 310 is connected to the transform feedback module 320 that helps low-pass filter the high frequency spurs and noise resulting from normal operation of the PID controller 310. In selected embodiments, the transformed feedback module 320 includes an input up-gain (Ks) stage 321, a feedback summer circuit 322, and internal gain stage (1/y gain) 323, a feedback gain (Kfb) stage 324, a feedback transformer 325, and an output down-gain (1/Ks) stage 326 connected as shown in a positive feedback configuration to generate the DCO control output signal (DCO_CTRL) from the manipulated variable (MV) provided by the PID controller 310.

In operation, the input up-gain (Ks) stage 321 and output down-gain (1/Ks) stage 326 are connected to scale "up" and "down," respectively, the input signal PCO and output DCO_CTRL for improved resolution. Since the digital loop filter 300 is implemented as a digital circuit which can only operate on integers, the function of the gain scaling stages 321, 326 is to convert any decimal values into a digital processing format. For example, if the input PCO signal PCO=8.235 needs to be processed, then without scaling (e.g., Ks=1), the PCO value would be processed as "8" due to truncation. However, by applying a scaling factor of Ks=1000 at the input up-gain (Ks) stage 321, the number "8235" will be processed, thereby providing increased resolution (as compared to processing only "8"). After subsequent processing at the transformed feedback module 320, the results are scaled back by the output down-gain (1/Ks) stage 326, thereby generating the DCO control output. Without scaling, truncation can cause loss of signal information, resulting in computational errors.

In the transformed feedback module 320, the feedback summer circuit 322 and internal gain stage (1/y gain) 323 are connected in series between the input up-gain stage 321 and output down-gain stage 326. In addition, a positive feedback path is connected from the output of the internal gain stage (1/y gain) 323 to an input of the feedback summer circuit. In particular, the feedback path includes a feedback gain (Kfb) stage 324 and feedback transformer 325 which are connected in series to generate an internal feedback signal INT_FBK for input to the feedback summer 322. In operation, the feedback summer circuit 322 sums the Ks-scaled signal provided by the input up-gain (Ks) stage 321 with an internal feedback signal INT_FBK, thereby generating the output sum signal, PCO(Ks)+INT_FBK. And at the internal gain stage (1/y_gain) 323, the output sum signal is amplified by applying a programmable gain factor $(Kn+Kfb(Kp+Ki+Kd))^{-1}$, thereby generating a scaled or internal DCO control signal (DCO_CTRL_INT). When enabled, the scaled/internal DCO control signal (DCO_CTRL_INT) is provided over the positive feedback path to the feedback summer circuit by amplifying the scaled/internal DCO control signal (DCO_CTRL_INT) with the feedback gain (Kfb) stage 324 and providing the amplified output to the feedback transformer 325 which includes element formed with a digital filter characterized by a feedback transformer function $(K_P+2K_D)z^{-1}-(K_D)z^{-2}$. At the output down-gain stage 326, the scaled/internal DCO control signal (DCO_CTRL_INT) provided by the internal gain stage (1/y_gain) 323 is down-scaled by applying a gain scaling factor 1/Ks, thereby generating the DCO control signal (DCO_CTRL).

By setting the programmable feedback gain value Kfb=0, the output from the internal gain stage (1/y_gain) 323 corresponds to the output generated by a conventional PID controller (e.g., PCO/Kn=MV/Kn) scaled up by the input up-gain Ks provided by the input up-gain (Ks) stage 321. As a result, signal from the output down-gain (1/Ks) stage 326 corresponds to the output generated by a conventional PID controller (e.g., $MV/Kn=e_k(K_P+Ki/1-z^{-1}+Kd(1-z^{-1}))/Kn$. In this configuration where Kfb=0, the transformed feedback module 320 does not provide any low-pass filtering on the generated DCO control signal DCO_CTRL which will include high frequency spurs that cause peak period jitter at the PID controller output.

However, by setting the programmable feedback gain value Kfb to a non-zero value (e.g., 0<Kfb), the output sum signal from the feedback summer circuit 322 is amplified at the internal gain stage 323 by the gain factor 1/y_gain=1/(Kn+Kfb(Kp+Ki+Kd)). With a non-zero setting of the programmable feedback gain value Kfb, the output from the internal gain stage 323 is connected over the feedback gain stage 324 to the feedback transformer 325 having specified characteristics $((K_P+2*K_D)z^{-1}-(K_D)z^{-2})$, thereby generating an internal feedback signal INT_FBK that provides a positive feedback path to the feedback summer circuit 322 for the transformed feedback module 320. In particular, the programmable loop filter feedback gain stage 324 applies the non-zero programmable feedback gain constant Kfb to the output from the internal gain stage (1/y_gain) 323, and the resulting output signal from the programmable loop filter feedback gain stage 324 is supplied to the feedback transformer 325 to generate the internal feedback signal INT_FBK. In this configuration where Kfb≠0, the transformed feedback module 320 uses the characteristics of the feedback transformer 325 to effectively provide low-pass filtering on the generated DCO control signal DCO_CTRL to remove high frequency spurs, thereby reducing peak period jitter at the PID controller output.

As disclosed herein, the appropriate value for programmable feedback gain element (e.g., 0<Kfb<4) will enable the digital loop filter 300 to generate a DCO control signal with reduced peak-to-peak period jitter by using the digital transformed feedback module 320 to reduce high frequency spurs from the PID controller 310. Generally speaking, a Kfb value between 0 to 4 will work, depending on the other loop parameters (Kp, Ki, Kd, Kn) chosen for the digital loop filter 300. In selected embodiments, a value of Kfb=2 works well. If the Kfb value is too small, then the transformed feedback module 320 will not provide sufficient low pass filtering characteristic for the digital loop filter 300. On the other hand, If the Kfb value is too large, this can reduce the bandwidth and could cause stability issues. As will be appreciated, digital phase lock loop simulations may be needed to find an optimal value for a given design.

In accordance with the present disclosure, the transformed feedback module 320 can be readily implemented in RTL to effectively mimic the effect of small capacitor (low pass filter) that is used in analog PLL to filter out DCO ripples. In particular, the low-pass characteristic for removing high frequency spurs from the DCO control signal DCO_CTRL is achieved by adding a high-pass feedback transformer element 325 in the positive feedback path. And by including the programmable feedback gain value Kfb in the internal gain stage 323 and loop filter feedback gain stage 324, the resulting structure allows the flexibility of adding or removing the feedback based on programmable gain Kfb.

To characterize the circuit functionality of the digital loop filter 300, the following mathematical relationships can be derived. Firstly, the UP/DN inputs to the PID controller 310 may be characterized as an effective input x=UP−DN. Based on these inputs, the PID controller 310 and transformed feedback module 320 are connected to generate the DCO control signal DCO_CTRL that regulates the digitally controlled oscillator to provide a correct frequency. In particular, the transformed feedback module 320 generates DCO_CTRL=$(x \cdot A(z) \cdot Kn+DCO\_CTRL \cdot Kfb((Kp+2Kd)z^{-1}-Kd\ z^{-2})) \cdot (y\_gain)^{-1}$. In this equation, the term A(z) represents the output of a conventional PID controller, $A(z)=(Kp+Ki/1-z^{-1}+Kd(1-z^{-1}))/Kn$. In addition, the term $(y\_gain)^{-1}$ is the gain provided by the internal gain stage (1/y_gain) 323, 1/y_gain=1/(Kn+Kfb(Kp+Ki+Kd)). As will be appreciated, the scaling factors Ks, 1/Ks can be added at the gain scaling stages 321, 326 to increase resolution when implemented in RTL without changing the final computation of the DCO control signal DCO_CTRL.

As seen from the foregoing, the digital loop filter 300 depicted in FIG. 3 is mathematically equivalent to the digital loop filter 200 depicted in FIG. 2 if the gain scaling stages 321, 326 are removed from the digital loop filter 300. Stated another way, by setting the gain scaling factor Ks=1, the digital loop filter 300 depicted in FIG. 3 is a practical digital implementation of the digital loop filter 200 depicted in FIG. 2.

Figure 4:
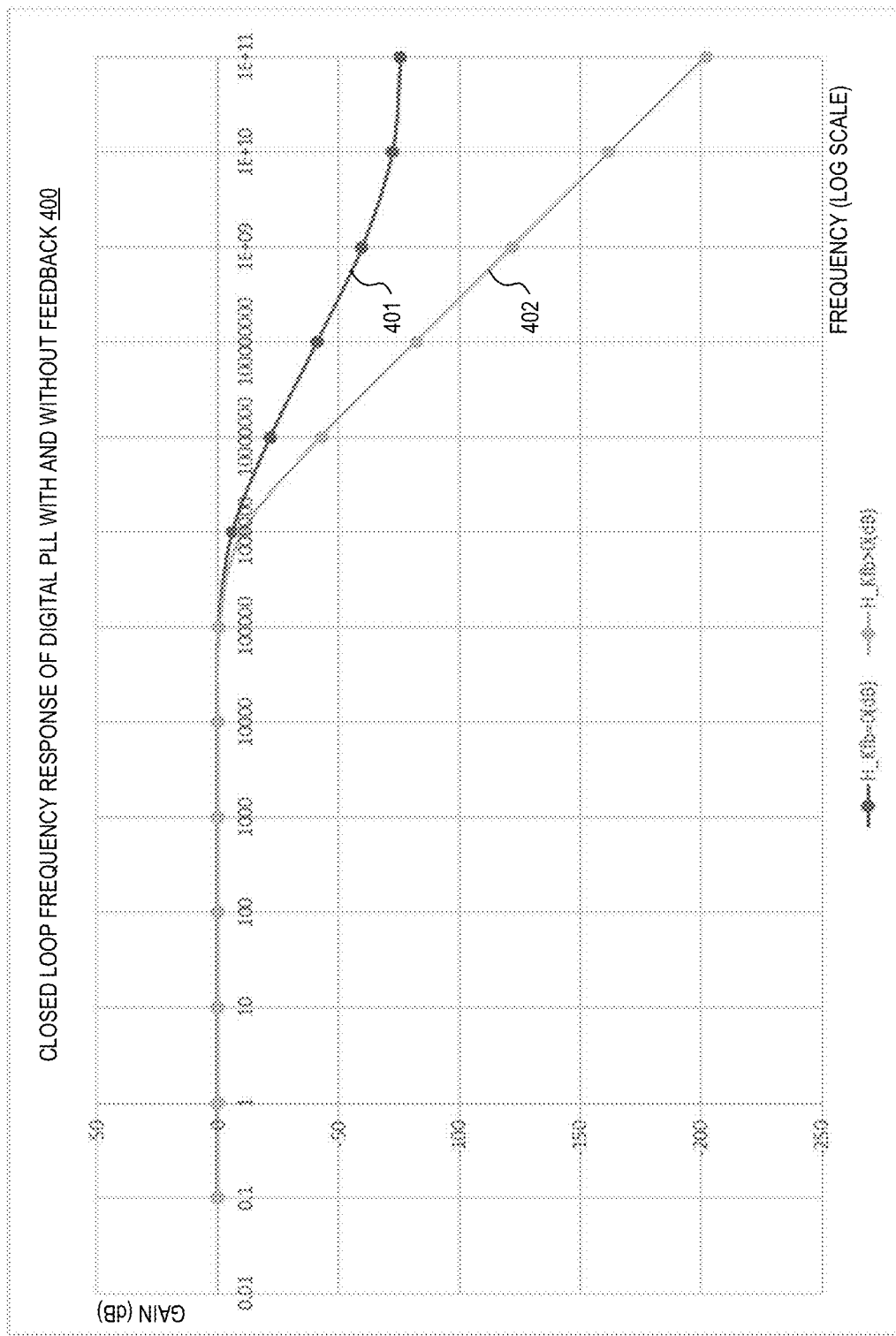
FIG. 4 illustrates the closed loop frequency responses of a digital PLL with and without PID feedback transformation in accordance with selected embodiments of the present disclosure.

As disclosed herein, the digital loop filter 300 may be included in a digital phase lock loop circuit, such as the digital phase-locked loop (PLL) circuit 100 shown in FIG. 1, to reduce or eliminate high frequency spurs and noise that can be generated by the PID controller. The performance of the digital loop filter 300 in removing or low-pass filtering the high frequency spurs and noise described hereinabove will be explained with reference to FIG. 4 which illustrates the closed loop frequency responses 400 of a digital PLL circuit with and without PID feedback transformation in accordance with selected embodiments of the present disclosure. Plotted as a function of the digital PLL gain versus signal frequency (on a log scale), the first closed loop frequency response 401 illustrates that the output of the digital PLL when the programmable feedback gain value is set to Kfb=0. With this setting, there is no feedback provided in the digital transformed feedback module, resulting in relatively little low pass filtering. However, when the programmable feedback gain value is set to a non-zero value (Kfb>0) so that the digital transformed feedback module includes a positive feedback path, the resulting second closed loop frequency response 402 has a relatively larger low pass filtering performance which helps reduce or eliminate high frequency spurs and noise that can be generated by the PID controller.

Figure 5:
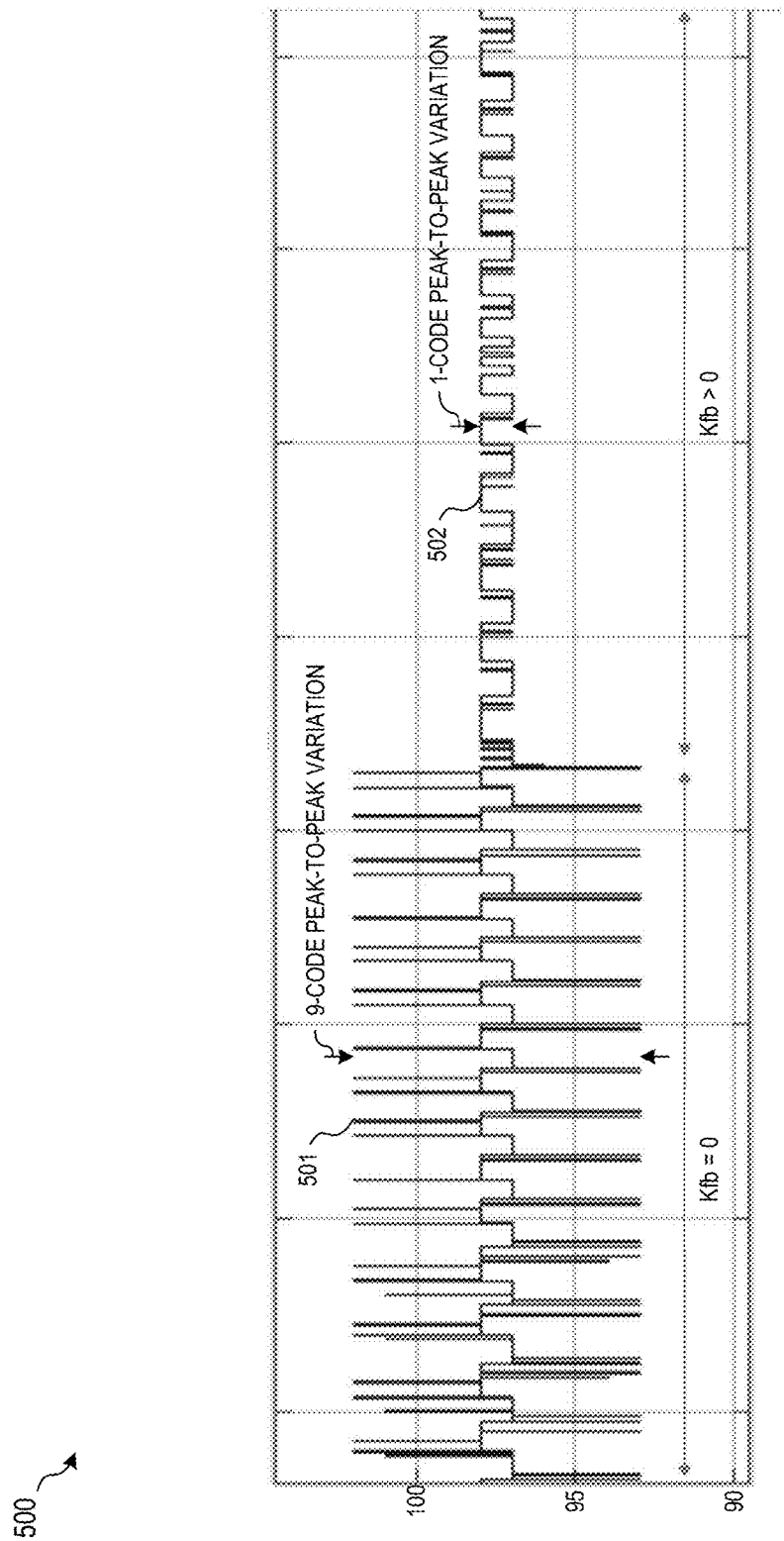
FIG. 5 illustrates DCO control signal waveforms with and without PID feedback transformation in accordance with selected embodiments of the present disclosure.

To further illustrate the performance benefits of using the digital loop filter to reduce or eliminate high frequency spurs and noise, reference is now made to FIG. 5 which illustrates simulated DCO output waveforms 500 with and without PID feedback transformation in accordance with selected embodiments of the present disclosure. Plotted as a function of the DCO control signal DCO_CTRL over time, the first simulated waveform 501 illustrates the DCO control signal DCO_CTRL that is generated when the programmable feedback gain value is set to Kfb=0. With this setting, there is no feedback provided in the digital transformed feedback module, resulting in relatively large peak-to-peak variations (e.g., 9-codes) that are shown with the spikes in the first simulated waveform 501. However, when the programmable feedback gain value is set to a non-zero value (Kfb>0) so that the digital transformed feedback module includes a positive feedback path, resulting second simulated waveform 502 having much smaller peak-to-peak variations (e.g., 1-code) which directly helps reduce peak-peak period jitter.

As indicated hereinabove, the DCO control signal generated by the digital loop filter may be applied to directly control the digitally controlled oscillator. However, it is common in digital PLL circuit applications to use a binary-to-thermometer decoder at the output of the digital loop filter to control the DCO which directly converts the binary DCO control signal into a thermometric code which progresses through each stage of the DCO only after exhausting all adjustments to current stage. This approach can result in each stage of the DCO having different delays since all phases of the DCO are not equally spaced. The input value dependent duty cycle variation of the DCO output can be quite significant.

To address these deficiencies with conventional binary-to-thermometer decoder and provide improved performance by achieving uniform delays from each stage of the DCO that reduce variation in duty cycle, selected embodiments of the present disclosure provide an encoder/thermometric decoder module (e.g., 108 in FIG. 1) that includes a binary input encoder (which converts a binary input to an encoded binary code) and a decoder (which converts the encoded binary code to a thermometric code), thereby generating a decoded DCO control output signal (DCO_CTRL_DEC) to the DCO.

Figure 6:
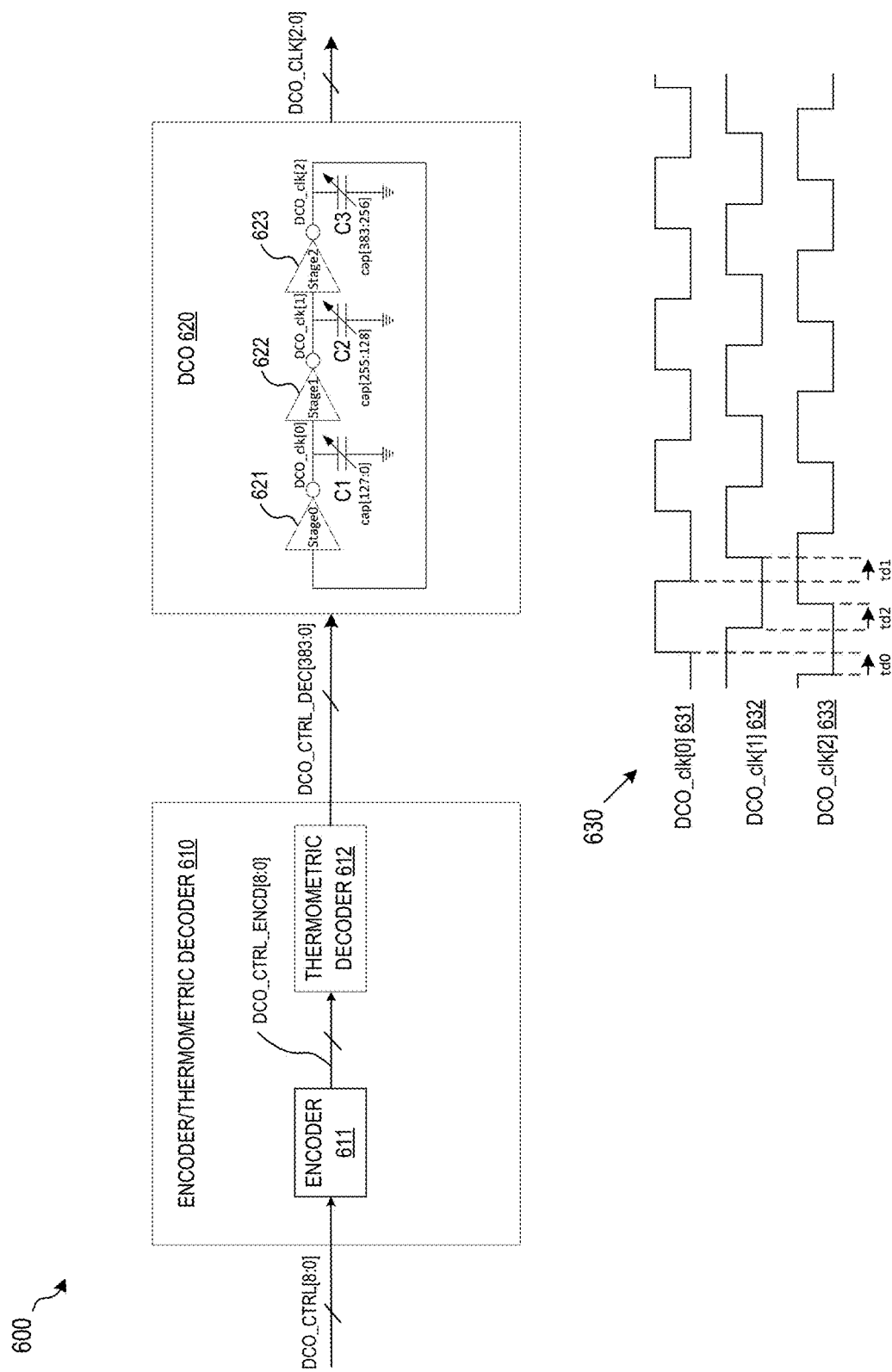
FIG. 6 illustrates a simplified block diagram of an encoder and thermometric decoder for converting a first DCO control signal to a thermometric code that can be used to equalize the delay of multiple stages of the DCO in accordance with selected embodiments of the present disclosure.

To provide additional details for an improved understanding of encoder/thermometric decoder module embodiments, reference is now made to FIG. 6 which illustrates a simplified block diagram 600 of an encoder/thermometric decoder block 610 connected to control a DCO 620 in response to a DCO control signal DCO_CTRL. In operation, the encoder/thermometric decoder block 610 converts a first DCO control signal DCO_CTRL to a thermometric code DCO_CTRL_DEC that can be used to equalize the delay of multiple stages of the DCO 620.

Generally speaking, the DCO 620 may be implemented as a multi-stage oscillator which receives an input digital code and generates a signal oscillated at an oscillating frequency in response to the digital code. For example, the depicted DCO 620 is a three-stage DCO having a plurality of stages coupled in a cyclic manner, including a first stage inverter 621 connected to a first shunt capacitor C1 which generates a first clock output DCO_clk[0], a second stage inverter 622 connected to a second shunt capacitor C2 which generates a second clock output DCO_clk[1], and a third stage inverter 623 connected to a third shunt capacitor C3 which generates a third clock output DCO_clk[2]. As illustrated with the timing diagram 630, there are delays between the respective clock outputs caused at each stage. For example, the first stage inverter 621 causes a first delay td0 between when the input clock DCO_clk[2] 633 falls and the output clock DCO_clk[0] 631 rises. In addition, the second stage inverter 622 causes a second delay td1 between when the input clock DCO_clk[0] 631 falls and the output clock DCO_clk[1] 632 rises. Finally, the third stage inverter 623 causes a third delay td2 between when the input clock DCO_clk[1] 632 falls and the output clock DCO_clk[2] 633 rises. Since the input thermometric code to the DCO 620 progresses from one stage of the DCO only after exhausting all adjustments to a current stage, the resulting delays td0, td1, td2 at each stage can be different, resulting in unequal spacing of the DCO phases.

In order to equalize DCO stage delays td0, td1, td2, each of the shunt capacitors C1, C2, C3 may be implemented with switched capacitor banks having values that can be controlled by the input thermometric code DCO_CTRL_DEC [383:0] to provide 128 levels of controllable delay at each stage. For example, the first 128 bits of the input thermometric code DCO_CTRL_DEC[383:0] may be used as the first capacitor control signal cap [127:0] to control the delay td0 of the first stage inverter 621. In addition, the next 128 bits of the input thermometric code DCO_CTRL_DEC[383:0] may be used as the second capacitor control signal cap [255:128] to control the delay td1 of the second stage inverter 622. Finally, the last 128 bits of the input thermometric code DCO_CTRL_DEC[383:0] may be used as the third capacitor control signal cap [383:256] to control the delay td2 of the third stage inverter 623.

In order to equalize the delay of each DCO stage, the encoder/thermometric decoder block 610 is provided with an encoder block 611 which maps the input DCO control signal to an encoded binary code value which is processed by the thermometric decoder 612 to generate thermometric codes that equalize the delay at each stage of the DCO 620, thereby decreasing input dependent duty cycle variation at the DCO output clock signal DCO_CLK[2:0]. In particular, the encoder/thermometric decoder block 610 includes an encoder block 611 that is connected to receive a binary DCO control signal (e.g., DCO_CTRL[8:0]) from the digital loop filter. At the encoder block 611, the binary DCO control signal DCO_CTRL is converted to an encoded binary DCO control signal (e.g., DCO_CTRL_ENCD[8:0]). The encoder/thermometric decoder block 610 also includes a thermometric decoder block 612 that is connected to receive the encoded binary DCO control signal from the encoder block 611. At the thermometric decoder block 612, the encoded binary DCO control signal is converted to a thermometric DCO control signal (e.g., DCO_CTRL_DEC[383: 0]) that can be used to equalize the delay of multiple stages of the DCO in accordance with selected embodiments of the present disclosure.

As depicted, the encoder/thermometric decoder block 610 is connected to receive the input DCO control signal (DCO_CTRL) which is a numeric value that is proportional to the desired frequency of output clock signal DCO_CLK [2:0]. For example, if the input DCO control signal DCO_CTRL=0, this specifies a maximum delay value and minimum clock frequency for the output clock signal generated by the DCO 620. However, if the input DCO control signal DCO_CTRL=383, this specifies a minimum delay value and maximum clock frequency for the output clock signal generated by the DCO 620.

Without special encoding provided by the encoder/thermometric decoder block 610, an input DCO control signal can be decoded and provided to the DCO 620 as a thermometric code input value DCO_CTRL_DEC which has values varying between 0 to 383. When provided as capacitor control values to the three stages of the DCO 620, thermometric code values 0-127 represent stage 0, thermometric code values 128-255 represent stage 1, and thermometric code values 256-383 represent stage 2. As will be appreciated, any thermometric code input value that is applied to the DCO 620 turns OFF all capacitors below the thermometric code input value. For example, if the thermometric code input value DCO_CTRL_DEC=192, then capacitors 0-192 are turned off. As a result, for a value of 192, the delay through Stage® is minimal (since all caps are OFF), the delay through stage 1 is mid-point (since caps 128-192 are OFF but caps 193-255 are ON), and stage 2 is maximum (all caps are on). This illustrates how the different DCO stages can have different delay values. As will be appreciated, this example can be extended to DCOs with additional stages.

With special encoding provided by the encoder/thermometric decoder block 610, the input DCO control signal DCO_CTRL is mapped by the encoder 611 to an encoded binary code value DCO_CTRL_ENCD which gives it a unique property such that, upon being decoded by the thermometric decoder 612, the resulting thermometric code input value DCO_CTRL_DEC provided to the DCO 620 turns OFF an equal number of capacitors (+/−1) in each DCO stage for any given input. And if needed, additional caps are turned OFF for overflow values. For example, if the input DCO control signal DCO_CTRL=192, then the encoder 611 maps the input DCO control signal to an encoded binary code value DCO_CTRL_ENCD=64. Upon being decoded by the thermometric decoder 612, the resulting thermometric code input value DCO_CTRL_DEC provided to the DCO 620 turns ON 64 caps in each stage. In addition, if the input DCO control signal DCO_CTRL=128, then the encoder 611 maps the input DCO control signal to an encoded binary code value DCO_CTRL_ENCD=298 (0x12A). Upon being decoded by the thermometric decoder 612, the resulting thermometric code input value DCO_CTRL_DEC provided to the DCO 620 turns OFF 42 caps in each stage, and also turns OFF one more cap in stage 0 and 1 (MSB='b10).

In order to map the input DCO control signal DCO_CTRL to an encoded binary code value DCO_CTRL_ENCD that will result in uniform delays at each DCO stage, selected embodiments of the encoder 611 may be embodied with control logic and/or hardware to implement an encoding function which is converted by the thermometric decoder 612 to generate thermometric code values DCO_CTRL_DEC which are applied to the shunt capacitors C1, C2, C3 to equalize the stage delays td0, td1, td2. For example, selected embodiments of the encoder 611 may be embodied with control logic and/or hardware to implement the encoding function DCO_CTRL_ENCD=(DCO_CTRL×128) MOD 383. In other embodiments, the encoder 611 may be embodied with a smaller hardware profile by implementing the encoding function DCO_CTRL_ENCD=128 (DCO_ctrl MOD 3)+FLOOR(DCO_CTRL/3). In selected embodiments, additional logic may be included in the thermometric decoder 612 to turn OFF additional caps based on the values of the encoded binary code value DCO_CTRL_ENCD [8:7]. As will be appreciated, the encoding function expressions embodied in the encoder 611 may be scaled depending on the number of stages used in DCO 620 and the number of delay steps per stage.

Figure 7:
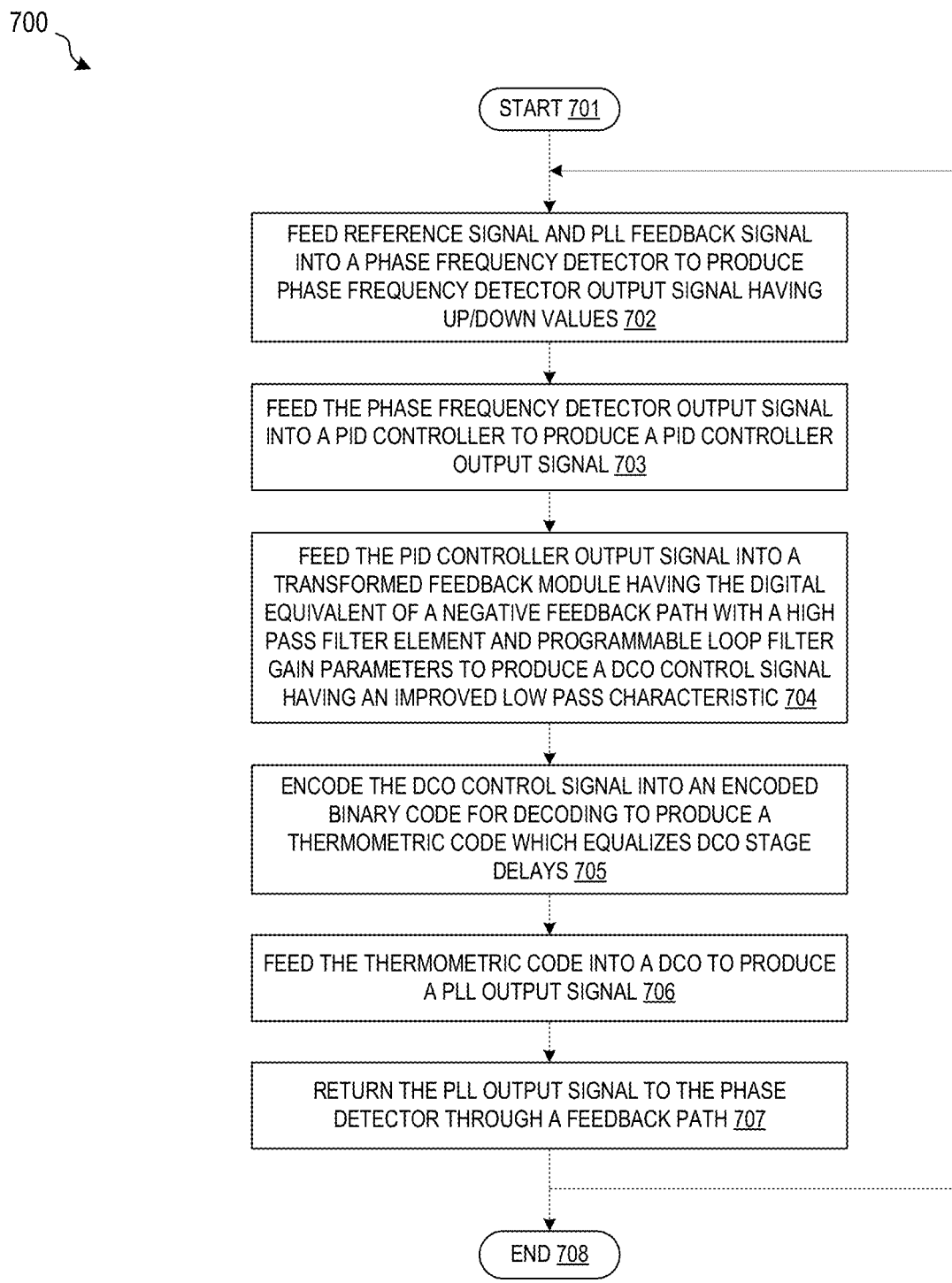
FIG. 7 illustrates a simplified flowchart showing the logic for controlling the operation of a digital PLL in accordance with the disclosed embodiments.

Turning now to FIG. 7, there is shown a simplified flowchart diagram 700 showing the logic for controlling the operation of a digital PLL (DPLL) in accordance with the disclosed embodiments. When the operation of the digital PLL starts (701), the DPLL circuitry feeds a reference signal and a feedback signal into the phase frequency detector to produce an output signal comprising up/down values (step 702). Next, the circuitry feeds the phase-detector output signal into a PID controller to produce a PID controller output signal (step 703). During step 703, a digital loop filter parameter control unit may dynamically generate loop-filter gain parameters Kp, Ki, and Kd for the PID controller. At step 704, the DPLL circuitry feeds the PID controller output signal into a transformed feedback module having the digital equivalent of a negative feedback path with a high pass filter element and programmable loop filter feedback gain parameter to produce a DCO control signal having an improved low pass characteristic. At step 704, the digital loop filter parameter control unit may dynamically generate the loop filter feedback gain parameter Kfb for the transformed feedback module to enable the connection of a feedback gain stage and feedback transformer to generate an internal feedback signal INT_FBK for positive feedback to the transformed feedback module. At step 705, the DCO control signal is encoded into an encoded binary code for subsequent decoding to produce thermometric codes which equalize the DCO stage delays. Next, the DPLL feeds the thermometric code into a digitally controlled oscillator (DCO) to produce a PLL output signal (step 706). Finally, the DPLL circuit returns the PLL output signal to the phase frequency detector through feedback path (step 707) and the steps 702-707 are repeated until the method ends (step 708).

By now it should be appreciated that there is provided herein a method and apparatus for generating a control signal to control a digitally controlled oscillator which generates a phase locked loop clock signal. In the disclosed methodology and apparatus, a phase-frequency detector (PFD) is connected to receive an input reference signal and a feedback signal as inputs and configured to produce a PFD output signal comprising up/down values. In addition, a digital loop filter is connected between the PFD and a digitally controlled oscillator (DCO). The digital loop filter includes a proportional-integral-derivative (PID) controller that is connected to receive the PFD output signal as an input and that is configured to produce a PID controller output signal. The digital loop filter also includes a transformed feedback module that includes feedback summer circuit and an internal gain stage connected in series to produce an M-bit control signal in response to the PID controller output signal, where an output from the internal gain stage is provided over a feedback path which includes a configurable feedback gain stage having a configurable non-zero gain value and a filter element to produce the internal feedback signal which is summed with the PID controller output signal at the feedback summer circuit to low pass filter high frequency spurs and noise from the PID controller output signal. In selected embodiments, the configurable feedback gain stage applies a configurable feedback gain parameter Kfb having a value 0<Kfb<4. In such embodiments, the series-connected feedback summer circuit and internal gain stage may be connected between an input stage (which applies an up-gain parameter (Ks) to the PID controller output signal) and an output stage (which applies a down-gain parameter (1/Ks) to the output from the internal gain stage). In addition or in the alternative, the configurable feedback gain stage may apply a configurable feedback gain parameter Kfb to the DCO control signal. In addition or in the alternative, the filter element may include a digital filter characterized by a feedback transformer function $(K_P+2K_D)z^{-1}-(K_D)z^{-2}$. In addition or in the alternative, the internal gain stage applies a gain parameter $(Kn+Kfb(Kp+Ki+Kd))^{-1}$, where Kn is a PID controller gain scaling parameter, Kfb is a feedback gain parameter, Kp is a proportional gain parameter, Ki is an integral gain parameter, and Kd is a derivative gain parameter. In the disclosed methodology and apparatus, the DCO is connected to directly or indirectly receive the M-bit control signal and is configured to produce a PLL output signal. In addition, the feedback path is connected to receive the PLL output signal as an input and is configured to produce the feedback signal for return to the phase-frequency detector. The disclosed method and apparatus may also include a loop-parameter control unit which dynamically generates a plurality of gain stage parameters for the digital loop filter, including a gain scaling parameter Kn, a proportional gain parameter Kp, an integral gain parameter Ki, a derivative gain parameter Kd, and a feedback gain parameter Kfb. In selected embodiments, the disclosed methodology and apparatus may include an encoding mapping module that is connected to encode the M-bit control signal into an encoded binary signal which is decoded to produce a thermometric control signal which is provided to the DCO to equalize DCO stage delays in the DCO. When the encoding mapping module is connected and configured to receive the M-bit control signal as a DCO control signal DCO_CTRL, the encoding mapping module may generate an encoded binary signal DCO_CTRL_ENCD by implementing an encoding function DCO_CTRL_ENCD=(DCO_CTRL×128) MOD 383, or by implementing an encoding function DCO_CTRL_ENCD=128 (DCO_ctrl MOD 3)+FLOOR(DCO_CTRL/3).

In another form, there is provided a digital phase looked loop and method of operating same. In the disclosed methodology, a phase-frequency error measure is generated at a phase-frequency detector by detecting a difference between an input reference signal and a feedback signal. The disclosed methodology also includes providing the phase-frequency error measure to a proportional-integral-derivative (PID) controller to produce a PID controller output signal. In addition, the disclosed methodology includes providing the PID controller output signal to a transformed feedback module which includes a feedback summer circuit and an internal gain stage connected in series to produce an M-bit control signal, where an output from the internal gain stage is provided over an internal feedback path which includes a configurable feedback gain stage having a configurable non-zero gain value and a filter element to produce an internal feedback signal which is summed with the PID controller output signal at the feedback summer circuit to low pass filter high frequency spurs and noise from the PID controller output signal. In selected embodiments, the configurable feedback gain stage applies a configurable feedback gain parameter Kfb having a value 0<Kfb<4. In other embodiments, the filter element is embodied with a digital filter characterized by a feedback transformer function $(K_P+2K_D)z^{-1}-(K_D)z^{-2}$, where Kp is a proportional gain parameter for a proportional gain branch in the PID controller and Kd is a derivative gain parameter for a derivative gain branch in the PID controller. In other embodiments, the internal gain stage applies a gain parameter $(Kn+Kfb(Kp+Ki+Kd))^{-1}$, where Kn is a PID controller gain scaling parameter, Kfb is a feedback gain parameter, Kp is a proportional gain parameter, Ki is an integral gain parameter, and Kd is a derivative gain parameter. The disclosed methodology also includes generating a phase locked loop output signal from a digitally controlled oscillator in response to the M-bit control signal, and generating the feedback signal from the PLL output signal for feedback to the phase-frequency detector. In selected embodiments, the methodology includes dynamically generating a plurality of gain stage parameters for the PID controller and transformed feedback module comprising a gain scaling parameter Kn, a proportional gain parameter Kp, an integral gain parameter Ki, a derivative gain parameter Kd, and a feedback gain parameter Kfb. In selected embodiments, the methodology includes scaling the M-bit PID controller output signal with an n-bit first gain scaling factor Ks before being provided to the transformed feedback module, and also includes scaling the output from the internal gain stage with a second gain scaling factor 1/Ks to generate the M-bit control signal before being provided to the digitally controlled oscillator. In selected embodiments, the disclosed methodology may include providing the M-bit control signal to an encoding mapping module as a DCO control signal DCO_CTRL where it is encoded to generate an encoded binary signal DCO_CTRL_ENCD, and then decoding the encoded binary signal DCO_CTRL_ENCD with a thermometric decoder to produce a thermometric control signal which is provided to the digitally controlled oscillator to equalize stage delays in the digitally controlled oscillator. In selected embodiments, the encoding mapping module may implement an encoding function DCO_CTRL_ENCD=(DCO_CTRL×128) MOD 383. In other embodiments, the encoding mapping module may implement an encoding function DCO_CTRL_ENCD=128 (DCO_ctrl MOD 3)+FLOOR(DCO_CTRL/3).

In yet another embodiment, there is disclosed a digital loop filter connected to receive a phase-frequency detector output signal comprising up/down values and configured to generate an M-bit control signal for a digitally controlled oscillator (DCO). As disclosed, the digital loop filter includes a proportional-integral-derivative (PID) controller and a transformed feedback module. Configured to produce a n M-bit PID controller output signal, the PID controller includes differential summer circuit which is connected to receive the PFD output signal as an input and configured to generate an error measure; a proportional gain branch which is connected to receive the error measure and includes a first gain buffer which applies a programmable proportional gain constant Kp to produce a proportional output $P_{OUT}$; an integral gain branch which is connected to receive the error measure and includes a second gain buffer which applies a programmable integral gain constant Ki to produce an integral output $I_{OUT}$; a derivative gain branch which is connected to receive the error measure and which includes a third gain buffer which applies a programmable derivative gain constant Kd to produce a derivative output $D_{OUT}$; and a compensation summer which combines the proportional output $P_{OUT}$, the integral output $I_{OUT}$, and the derivative output $D_{OUT}$, thereby generating the PID controller output signal. Connected to produce the M-bit control signal for the DCO, the transformed feedback module includes an input gain buffer which is connected to receive the M-bit PID controller output signal and configured to generate an upscaled (M+n)-bit PID controller output signal by applying a first gain scaling factor Ks to the PID controller output signal; an output gain buffer which is connected to receive an (M+n)-bit control signal and configured to generate the M-bit control signal for the DCO by applying a second gain scaling factor 1/Ks to the (M+n)-bit control signal; and a feedback summer circuit and an internal gain stage which are connected in series between the input gain buffer and output buffer to produce the (M+n)-bit control signal which is provided over an internal feedback path comprising a configurable feedback gain stage having a configurable non-zero gain value Kfb and a filter element to produce an internal feedback signal which is summed with the upscaled (M+n)-bit PID controller output signal at the feedback summer circuit to low pass filter high frequency spurs and noise from the M-bit PID controller output signal. In the disclosed digital loop filter, the internal gain stage applies a gain parameter $(Kn+Kfb(Kp+Ki+Kd))^{-1}$. In addition, the filter element includes a digital filter characterized by a feedback transformer function $(K_P+2K_D)z^{-1}-(K_D)z^{-2}$, Kp is a proportional gain parameter for a proportional gain branch in the PID controller and Kd is a derivative gain parameter for a derivative gain branch in the PID controller.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and flow charts illustrating design and operational details of a digital PLL system with associated software modules and/or hardware devices in which one or more gain control parameters may be adjusted without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Some portions of the detailed descriptions provided herein are also presented in terms of algorithms and instructions that operate on data that is stored in a computer memory. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of hardware or a computer system or a similar electronic computing device, that manipulates and transforms data represented as physical (electronic) quantities within registers and memories into other data similarly represented as physical quantities within the memories or registers or other such information storage, transmission or display devices.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems."

However, other modifications, variations and alternatives are also possible. The specifications and drawings are, accordingly, to be regarded in an illustrative rather than in a restrictive sense.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital phase-locked loop (PLL), comprising:
a phase-frequency detector (PFD) connected to receive an input reference signal and a feedback signal as inputs and configured to produce a PFD output signal comprising up/down values;
a digital loop filter comprising:
   a proportional-integral-derivative (PID) controller connected to receive the PFD output signal as an input and configured to produce a PID controller output signal, and
   a transformed feedback module comprising a feedback summer circuit and an internal gain stage connected in series to produce an M-bit control signal in response to the PID controller output signal, wherein an output from the internal gain stage is provided over a feedback path comprising a configurable feedback gain stage having a configurable non-zero gain value and a filter element to produce the internal feedback signal which is summed with the PID controller output signal at the feedback summer circuit to low pass filter high frequency spurs and noise from the PID controller output signal, where the filter element comprises a digital filter characterized by a feedback transformer function $(Kp+2Kd)z^{-1}-(Kd)z^{-2}$, where Kp is a proportional gain parameter, and Kd is a derivative gain parameter;
a digitally controlled oscillator (DCO) which is connected to directly or indirectly receive the M-bit control signal and configured to produce a PLL output signal; and
a feedback path connected to receive the PLL output signal as an input and configured to produce the feedback signal for return to the phase-frequency detector.

2. The digital phase-locked loop of claim 1, further comprising a loop-parameter control unit which dynamically generates a plurality of gain stage parameters for the digital loop filter comprising a gain scaling parameter Kn, a proportional gain parameter Kp, an integral gain parameter Ki, a derivative gain parameter Kd, and a feedback gain parameter Kfb.

3. The digital phase-locked loop of claim 1, where the configurable feedback gain stage applies a configurable feedback gain parameter Kfb to the DCO control signal.

4. A digital phase-locked loop (PLL), comprising:
a phase-frequency detector (PFD) connected to receive an input reference signal and a feedback signal as inputs and configured to produce a PFD output signal comprising up/down values;
a digital loop filter comprising:
   a proportional-integral-derivative (PID) controller connected to receive the PFD output signal as an input and configured to produce a PID controller output signal, and
   a transformed feedback module comprising a feedback summer circuit and an internal gain stage connected in series to produce an M-bit control signal in response to the PID controller output signal, wherein an output from the internal gain stage is provided over a feedback path comprising a configurable feedback gain stage having a configurable non-zero gain value and a filter element to produce the internal feedback signal which is summed with the PID controller output signal at the feedback summer circuit to low pass filter high frequency spurs and noise from the PID controller output signal;
a digitally controlled oscillator (DCO) which is connected to directly or indirectly receive the M-bit control signal and configured to produce a PLL output signal; and
a feedback path connected to receive the PLL output signal as an input and configured to produce the feedback signal for return to the phase-frequency detector,
where the configurable feedback gain stage applies a configurable feedback gain parameter Kfb having a value 0<Kfb<4.

5. A digital phase-locked loop (PLL), comprising:
a phase-frequency detector (PFD) connected to receive an input reference signal and a feedback signal as inputs and configured to produce a PFD output signal comprising up/down values;
a digital loop filter comprising:
   a proportional-integral-derivative (PID) controller connected to receive the PFD output signal as an input and configured to produce a PID controller output signal, and
   a transformed feedback module comprising a feedback summer circuit and an internal gain stage connected in series to produce an M-bit control signal in response to the PID controller output signal, wherein an output from the internal gain stage is provided over a feedback path comprising a configurable feedback gain stage having a configurable non-zero gain value and a filter element to produce the internal feedback signal which is summed with the PID controller output signal at the feedback summer circuit to low pass filter high frequency spurs and noise from the PID controller output signal;
a digitally controlled oscillator (DCO) which is connected to directly or indirectly receive the M-bit control signal and configured to produce a PLL output signal; and
a feedback path connected to receive the PLL output signal as an input and configured to produce the feedback signal for return to the phase-frequency detector,
where the series-connected feedback summer circuit and internal gain stage are connected between an input stage applying an up-gain parameter (Ks) to the PID controller output signal and an output stage applying a down-gain parameter (1/Ks) to the output from the internal gain stage.

6. A digital phase-locked loop (PLL), comprising:
a phase-frequency detector (PFD) connected to receive an input reference signal and a feedback signal as inputs and configured to produce a PFD output signal comprising up/down values;
a digital loop filter comprising:
   a proportional-integral-derivative (PID) controller connected to receive the PFD output signal as an input and configured to produce a PID controller output signal, and
   a transformed feedback module comprising a feedback summer circuit and an internal gain stage connected in series to produce an M-bit control signal in response to the PID controller output signal, wherein an output from the internal gain stage is provided over a feedback path comprising a configurable feedback gain stage having a configurable non-zero gain value and a filter element to produce the internal feedback signal which is summed with the PID controller output signal at the feedback summer circuit to low pass filter high frequency spurs and noise from the PID controller output signal;

a digitally controlled oscillator (DCO) which is connected to directly or indirectly receive the M-bit control signal and configured to produce a PLL output signal; and a feedback path connected to receive the PLL output signal as an input and configured to produce the feedback signal for return to the phase-frequency detector, where the internal gain stage applies a gain parameter $(Kn+Kfb(Kp+Ki+Kd))^{-1}$, where Kn is a PID controller gain scaling parameter, Kfb is a feedback gain parameter, Kp is a proportional gain parameter, Ki is an integral gain parameter, and Kd is a derivative gain parameter.

7. A digital phase-locked loop (PLL), comprising:
a phase-frequency detector (PFD) connected to receive an input reference signal and a feedback signal as inputs and configured to produce a PFD output signal comprising up/down values;
a digital loop filter comprising:
　a proportional-integral-derivative (PID) controller connected to receive the PFD output signal as an input and configured to produce a PID controller output signal, and
　a transformed feedback module comprising a feedback summer circuit and an internal gain stage connected in series to produce an M-bit control signal in response to the PID controller output signal, wherein an output from the internal gain stage is provided over a feedback path comprising a configurable feedback gain stage having a configurable non-zero gain value and a filter element to produce the internal feedback signal which is summed with the PID controller output signal at the feedback summer circuit to low pass filter high frequency spurs and noise from the PID controller output signal;
a digitally controlled oscillator (DCO) which is connected to directly or indirectly receive the M-bit control signal and configured to produce a PLL output signal;
a feedback path connected to receive the PLL output signal as an input and configured to produce the feedback signal for return to the phase-frequency detector; and
an encoding mapping module connected to encode the M-bit control signal into an encoded binary signal which is decoded to produce a thermometric control signal which is provided to the DCO to equalize DCO stage delays in the DCO.

8. The digital phase-locked loop of claim 7, where the encoding mapping module is connected and configured to receive the M-bit control signal as a DCO control signal DCO_CTRL and to generate an encoded binary signal DCO_CTRL_ENCD by implementing an encoding function DCO_CTRL_ENCD=(DCO_CTRL×128) MOD 383.

9. The digital phase-locked loop of claim 7, where the encoding mapping module is connected and configured to receive the M-bit control signal as a DCO control signal DCO_CTRL and to generate an encoded binary signal DCO_CTRL_ENCD by implementing an encoding function DCO_CTRL_ENCD=128 (DCO_ctrl MOD 3)+FLOOR (DCO_CTRL/3).

10. A method of operating a digital phase locked loop, comprising:
generating a phase-frequency error measure at a phase-frequency detector by detecting a difference between an input reference signal and a feedback signal;
providing the phase-frequency error measure to a proportional-integral-derivative (PID) controller to produce a PID controller output signal;
providing the PID controller output signal to a transformed feedback module comprising a feedback summer circuit and an internal gain stage connected in series to produce an M-bit control signal, where an output from the internal gain stage is provided over an internal feedback path comprising a configurable feedback gain stage having a configurable non-zero gain value and a filter element to produce an internal feedback signal which is summed with the PID controller output signal at the feedback summer circuit to low pass filter high frequency spurs and noise from the PID controller output signal;
generating a phase locked loop output signal from a digitally controlled oscillator in response to the M-bit control signal; and
generating the feedback signal from the PLL output signal for feedback to the phase-frequency detector;
providing the M-bit control signal to an encoding mapping module as a DCO control signal DCO_CTRL;
encoding the DCO control signal DCO_CTRL at the encoding mapping module to generate an encoded binary signal DCO_CTRL_ENCD; and
decoding the encoded binary signal DCO_CTRL_ENCD with a thermometric decoder to produce a thermometric control signal which is provided to the digitally controlled oscillator to equalize stage delays in the digitally controlled oscillator.

11. The method of claim 10, further comprising dynamically generating a plurality of gain stage parameters for the PID controller and transformed feedback module comprising a gain scaling parameter Kn, a proportional gain parameter Kp, an integral gain parameter Ki, a derivative gain parameter Kd, and a feedback gain parameter Kfb.

12. The method of claim 10, further comprising:
scaling the PID controller output signal with a first gain scaling factor Ks before being provided to the transformed feedback module; and
scaling the output from the internal gain stage with a second gain scaling factor 1/Ks to generate the M-bit control signal before being provided to the digitally controlled oscillator.

13. The method of claim 10, where the configurable feedback gain stage applies a configurable feedback gain parameter Kfb having a value 0<Kfb<4.

14. The method of claim 10, where the filter element comprises a digital filter characterized by a feedback transformer function $(K_P+2K_D)z^{-1}-(K_D)z^{-2}$, where Kp is a proportional gain parameter for a proportional gain branch in the PID controller and Kd is a derivative gain parameter for a derivative gain branch in the PID controller.

15. The method of claim 10, where the internal gain stage applies a gain parameter $(Kn+Kfb(K_P+Ki+Kd))^{-1}$, where Kn is a PID controller gain scaling parameter, Kfb is a feedback gain parameter, Kp is a proportional gain parameter, Ki is an integral gain parameter, and Kd is a derivative gain parameter.

16. The method of claim 10, where the encoding mapping module implements an encoding function DCO_CTRL_ENCD=(DCO_CTRL×128) MOD 383.

17. The method of claim 10, where the encoding mapping module implements an encoding function DCO_CTRL_ENCD=128 (DCO_ctrl MOD 3)+FLOOR(DCO_CTRL/3).

18. A digital loop filter connected to receive a phase-frequency detector output signal comprising up/down values and configured to generate an M-bit control signal for a digitally controlled oscillator (DCO), the digital loop filter comprising:
(a) a proportional-integral-derivative (PID) controller configured to produce an M-bit PID controller output signal, the PID controller comprising:
differential summer circuit which is connected to receive the PFD output signal as an input and configured to generate an error measure;
a proportional gain branch connected to receive the error measure and comprising a first gain buffer which applies a programmable proportional gain constant Kp to produce a proportional output $P_{OUT}$,
an integral gain branch connected to receive the error measure and comprising a second gain buffer which applies a programmable integral gain constant Ki to produce an integral output $I_{OUT}$,
a derivative gain branch connected to receive the error measure and comprising a third gain buffer which applies a programmable derivative gain constant Kd to produce a derivative output $D_{OUT}$, and
a compensation summer which combines the proportional output $P_{OUT}$, the integral output $I_{OUT}$, and the derivative output $D_{OUT}$, thereby generating the M-bit PID controller output signal; and
(b) a transformed feedback module connected to produce the M-bit control signal for the DCO, the transformed feedback module comprising:
an input gain buffer connected to receive the M-bit PID controller output signal and configured to generate an upscaled (M+n)-bit PID controller output signal by applying a first gain scaling factor Ks to the PID controller output signal,
an output gain buffer connected to receive an (M+n)-bit control signal and configured to generate the M-bit control signal for the DCO by applying a second gain scaling factor 1/Ks to the (M+n)-bit control signal, and
a feedback summer circuit and an internal gain stage connected in series between the input gain buffer and output buffer to produce the (M+n)-bit control signal which is provided over an internal feedback path comprising a configurable feedback gain stage having a configurable non-zero gain value Kfb and a filter element to produce an internal feedback signal which is summed with the upscaled (M+n)-bit PID controller output signal at the feedback summer circuit to low pass filter high frequency spurs and noise from the M-bit PID controller output signal,
where the internal gain stage applies a gain parameter $(Kn+Kfb(Kp+Ki+Kd))^{-1}$, and
where the filter element comprises a digital filter characterized by a feedback transformer function $(K_P+2K_D)z^{-1}-(K_D)z^{-2}$, Kp is a proportional gain parameter for a proportional gain branch in the PID controller and Kd is a derivative gain parameter for a derivative gain branch in the PID controller.

* * * * *